(12) United States Patent
Geiss et al.

(10) Patent No.: US 6,967,167 B2
(45) Date of Patent: Nov. 22, 2005

(54) SILICON DIOXIDE REMOVING METHOD

(75) Inventors: Peter J. Geiss, Underhill, VT (US); Alvin J. Joseph, Williston, VT (US); Xuefeng Liu, South Burlington, VT (US); James S. Nakos, Essex Junction, VT (US); James J. Quinlivan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 10/605,435

(22) Filed: Sep. 30, 2003

(65) Prior Publication Data

US 2005/0070101 A1   Mar. 31, 2005

(51) Int. Cl.$^7$ ........................................... H01L 21/302
(52) U.S. Cl. .................. 438/704; 438/706; 438/715; 438/723; 438/743; 438/744
(58) Field of Search ............... 438/704, 706, 438/715, 723, 743, 744

(56) References Cited

U.S. PATENT DOCUMENTS

| | | |
|---|---|---|
| 5,266,504 A | 11/1993 | Blouse et al. |
| 5,282,925 A | 2/1994 | Jeng et al. |
| 5,420,454 A | 5/1995 | Vook et al. |
| 5,620,907 A | 4/1997 | Jalali-Farahani et al. |
| 5,643,820 A | 7/1997 | Williams et al. |
| 5,786,622 A | 7/1998 | Ronkainen |
| 6,074,951 A * | 6/2000 | Kleinhenz et al. .......... 438/701 |
| 6,177,717 B1 | 1/2001 | Chantre et al. |
| 6,221,738 B1 * | 4/2001 | Sakaguchi et al. .......... 438/455 |
| 6,462,397 B2 | 10/2002 | Ryum et al. |
| 6,492,711 B1 | 12/2002 | Takagi et al. |
| 6,638,819 B1 * | 10/2003 | Joshi et al. ................. 438/256 |
| 2002/0158311 A1 | 10/2002 | Ohnishi et al. |
| 2002/0197807 A1 | 12/2002 | Jagannathan et al. |
| 2003/0060028 A1 | 3/2003 | Ward et al. |

* cited by examiner

Primary Examiner—Nadine Norton
Assistant Examiner—Binh X. Tran
(74) Attorney, Agent, or Firm—Anthony J. Canale; Hoffman, Warnick & D'Alessandro LLC

(57) ABSTRACT

A method for removing silicon dioxide residuals is disclosed. The method includes reacting a portion of a silicon dioxide layer (i.e., oxide) to form a reaction product layer, removing the reaction product layer and annealing in an environment to remove oxide residuals. The method finds application in a variety of semiconductor fabrication processes including, for example, fabrication of a vertical HBT or silicon-to-silicon interface without an oxide interface.

12 Claims, 5 Drawing Sheets

SILICON DIOXIDE REMOVING METHOD

BACKGROUND OF INVENTION

1. Technical Field

The present invention relates generally to semiconductor fabrication, and more particularly, to a silicon dioxide removing method useful for fabricating a hetero-junction bipolar transistor (HBT).

2. Related Art

Removal of silicon dioxide (i.e., oxide) is problematic relative to a variety of semiconductor fabrication processes such as fabrication of a raised source/drain complementary metal-oxide semiconductor (CMOS), silicon-on-insulator (SOI) devices, field-effect transistor (FET) gate oxide generation, etc. One illustrative process in which oxide residuals cause significant problems is the fabrication of silicon (Si) NPN and silicon-germanium (SiGe) HBTs. In this application, a thin oxide emitter-base interface traditionally separates the arsenic doped emitter polysilicon from the boron doped single crystal SiGe base. Referring to FIG. 1, a HBT 2 having a thin oxide emitter-base interface 4 is shown. Oxide interface 4 is known to control the holes re-injected back into emitter 6 as base 8 current, and the out-diffusion of arsenic from emitter 6 polysilicon into single crystal base 8. The arsenic out-diffusion forms the actual emitter-base junction in the single crystal silicon base 8. This oxide interface 4 is currently grown using a low temperature rapid thermal oxidation (RTO) process.

Problems related to oxide interface 4 arise relative to reducing emitter resistance (Re) of NPN transistors in conventional silicon-germanium (SiGe) technology. Reducing Re is advantageous because high Re causes collector current to roll off quickly. A thin oxide interface 4 (FIG. 1), described above, and the non-self aligned polysilicon emitter, are known to contribute significantly to Re. One approach to address this problem is to provide deposition of in-situ doped (ISD) arsenic amorphous silicon to form the emitter without an oxide interface. In this case, the amorphous region re-crystalizes off seed silicon of the base because there is no interfacial oxide. This approach reduces Re by as much as five times, and improves high performance HBT device cutoff frequency by approximately 6 GHz. Unfortunately, this approach is unreliable. First, some wafers within a lot exhibit high Re compared to the specified amount using this approach. Second, certain wafers exhibit high trans-wafer variation of Re using this approach. Some of the high Re wafers are also accompanied by lower NPN yield due to interference of oxide residuals at the interface, which causes local strain field distortion and misaligned dislocations. Accordingly, the ISD approach's unreliability makes it difficult for process control during manufacturing.

In view of the foregoing, there is a need in the art for an improved semiconductor cleaning method for removing oxide residuals.

SUMMARY OF INVENTION

The invention includes a method for removing silicon dioxide residuals from a surface of a semiconductor The method includes reacting a portion of a silicon dioxide layer (i.e., oxide) to form a reaction product layer, removing the reaction product layer and annealing the surface to remove oxide residuals. The method finds application in a variety of semiconductor fabrication processes. One example is the fabrication of an improved hetero-junction bipolar transistor (HBT) and an in-situ deposition (ISD) arsenic process for generating the HBT without an oxide interface at the emitter-base. In this case, the invention provides reduced Re, increased NPN yield and a more uniform Re distribution across a wafer without sacrificing any other device performance characteristics. In addition, the invention provides an improved NPN emitter process window to maintain a stable and manufacturable HBT process. The inventive method may also be implemented to form a silicon-to-silicon interface without an oxide interface.

A first aspect of the invention is directed to a method of removing silicon dioxide from a surface of a semiconductor, the method comprising the steps of: a) reacting the silicon dioxide to form a reaction product on the surface; b) removing the reaction product from the surface; and c) annealing the surface.

A second aspect of the invention is directed to a method of forming a vertical bipolar transistor having a single crystal base formed on a substrate, the method comprising the steps of: a) forming a silicon dioxide layer and a dielectric layer on the base; b) forming an emitter window in the dielectric layer over the base to expose a portion of the silicon dioxide layer; c) reacting the portion of the silicon dioxide layer to form a reaction product layer; d) removing the reaction product layer from the emitter window to expose a surface of a portion of the base; e) annealing the substrate and f) forming a single crystal emitter on the exposed surface of the base.

A third aspect of the invention is directed to a method of forming an interface between a first single crystal silicon layer and a second single crystal silicon layer, the method comprising the steps of: a) forming a silicon dioxide layer on the second single crystal silicon layer; b) reacting at least a portion of the silicon dioxide layer to form a reaction product layer; c) removing the reaction product layer to expose a surface of the second single crystal silicon layer; d) annealing the surface and e) forming the first single crystal silicon layer on the surface of the second single crystal silicon layer.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
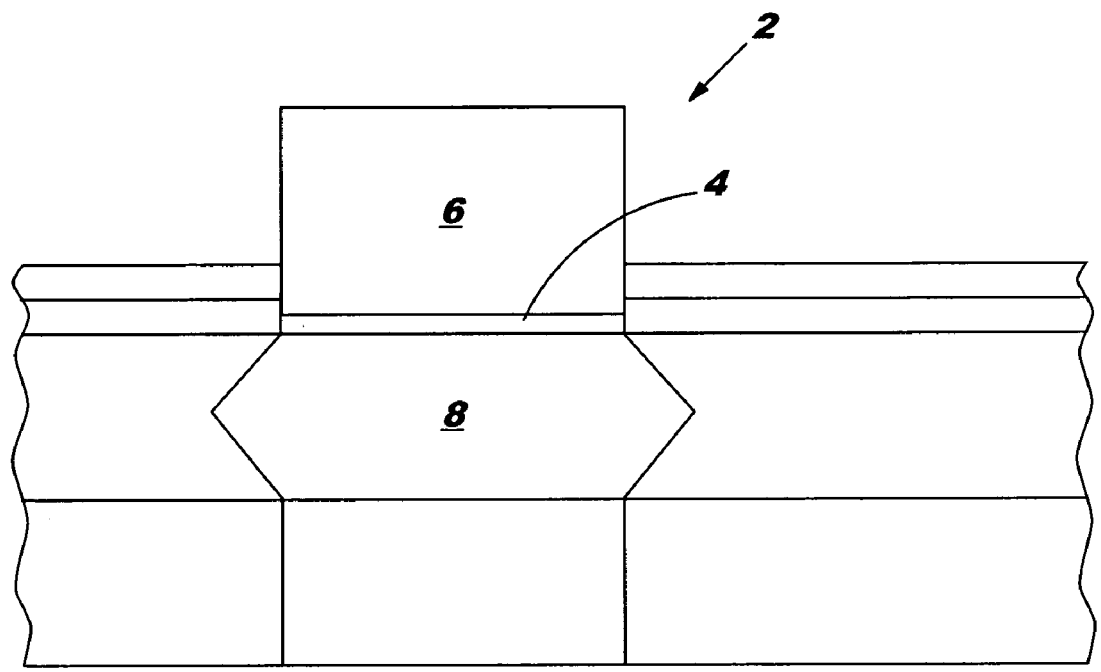
FIG. 1 shows a prior art HBT with a thin oxide emitter-base interface.
Figure 2:
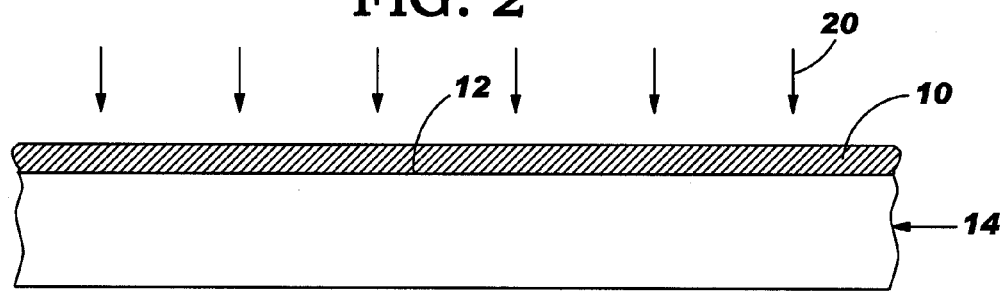
FIGS. 2–5 show a method for removing silicon dioxide according to the invention.
Figure 3:
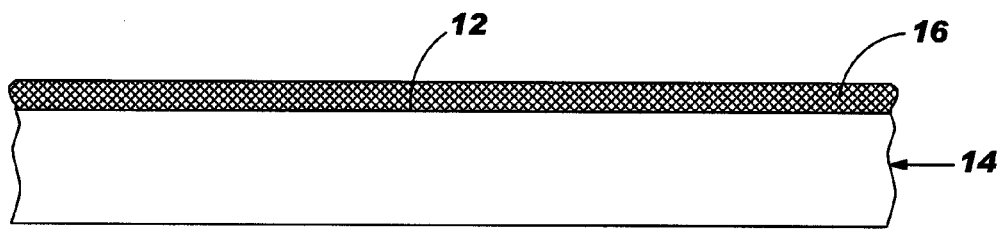

A method for removing silicon dioxide will now be described. In a first step of the method, as shown in FIGS. 2–3, a silicon dioxide (hereinafter "oxide") layer 10 (FIG. 2) that is present on a surface 12 of a semiconductor device 14, e.g., a substrate, is reacted to form a reaction product 16 (FIG. 3), as described in U.S. Pat. No. 5,282,925, which is hereby incorporated by reference. In one embodiment, oxide layer 10 is reacted by exposure to a vapor phase etch 20

(FIG. 2) comprising hydrogen fluoride and ammonia gas. In another embodiment, vapor phase etch 20 comprises ammonia bifluoride. The conditions and concentrations of material may vary according to specific applications. In one embodiment, the reaction occurs at room temperature and approximately 5 mTorr. Reaction product 16 (FIG. 3) includes etched oxide and reactants and combinations thereof.

Figure 4:
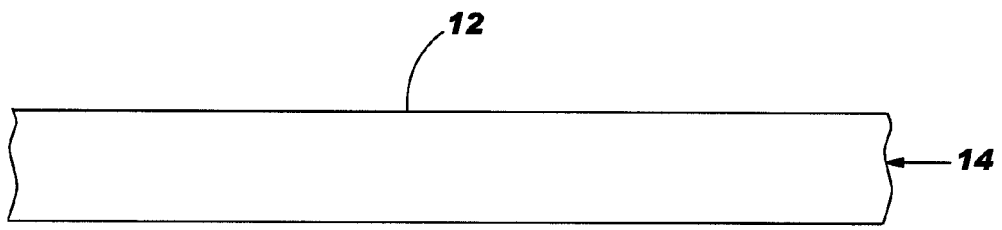

Next, as shown in FIG. 4, the reaction product is removed. In one embodiment, removal is accomplished by evaporating the reaction product from surface 12. Evaporation may be made, for example, by heating the substrate to approximately 100° C., as described in U.S. Pat. No. 5,282,925. In another embodiment, removal may be accomplished by rinsing surface 12 with water ($H_2O$), i.e., reaction product 16 is water soluble.

Figure 5:
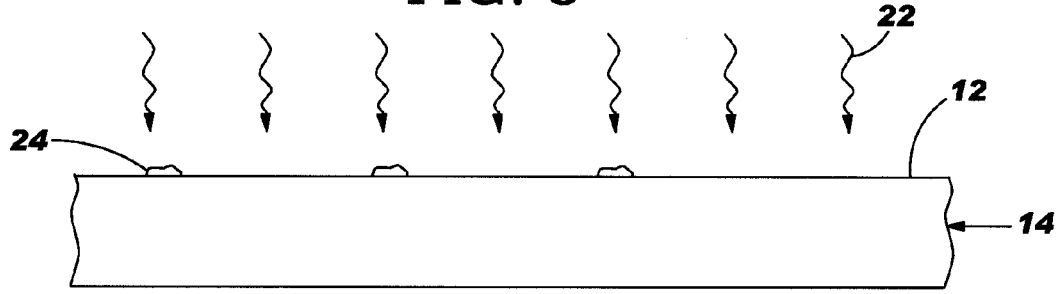

As shown in FIG. 5, the next step includes annealing surface 12, e.g., substrate, in an environment 22 such as, for example, a vacuum, a reducing atmosphere, or an inert atmosphere, to remove any remaining oxide 24 not removed during the removing step. In one embodiment, the reducing atmosphere comprises hydrogen ($H_2$).

The resulting surface 12 is substantially free of silicon dioxide, e.g., the oxygen dose at the surface is less than $2 \times 10^{14}/cm^2$.

EXAMPLE APPLICATION 1

Figure 6:
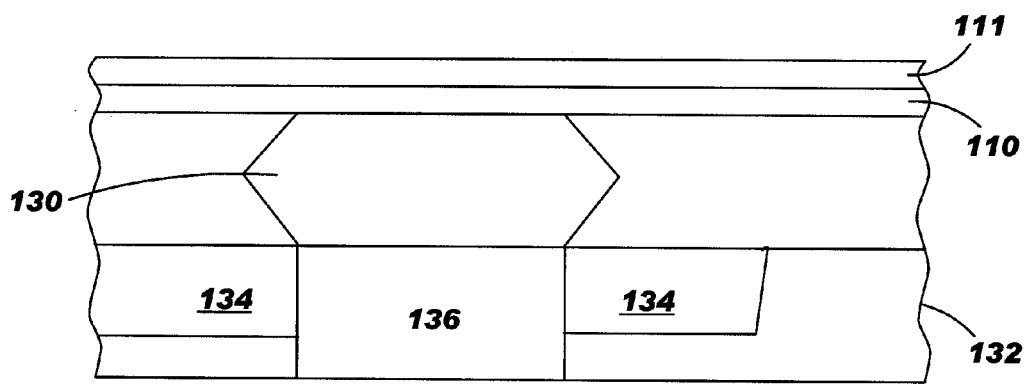
FIGS. 6–10 show a method of forming a vertical HBT using the method of FIGS. 2–5.
Figure 7:
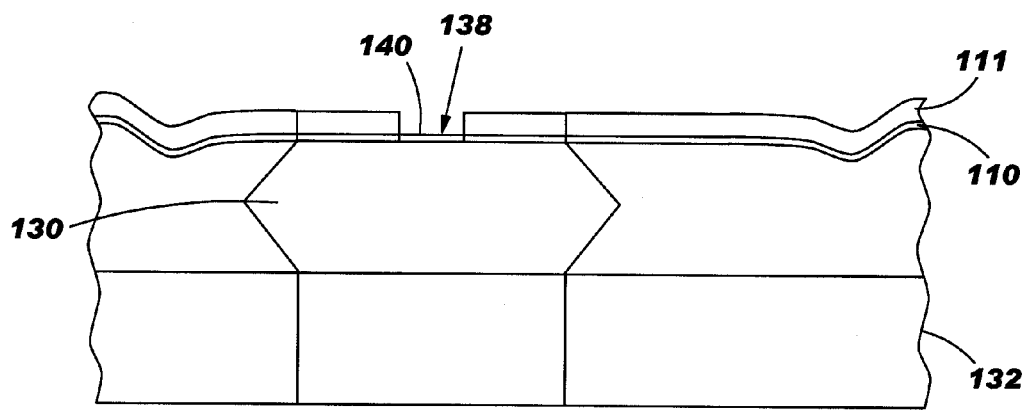

One example application of the above-described method is use in fabrication of a vertical HBT. According to the first embodiment, in a first step, shown in FIG. 6, a silicon dioxide layer 110 and a dielectric layer 111, e.g., silicon nitride, are formed on a single crystal base 130 of, for example, silicon (Si) or silicon-germanium (SiGe). FIG. 6 also shows other underlying structure such as substrate 132 including shallow trench isolations 134 and NPN intrinsic region 136. Next, as shown in FIG. 7, an emitter window 138 is formed in silicon nitride layer 111 over base 130 to expose a portion 140 of silicon dioxide layer 110.

Figure 8:
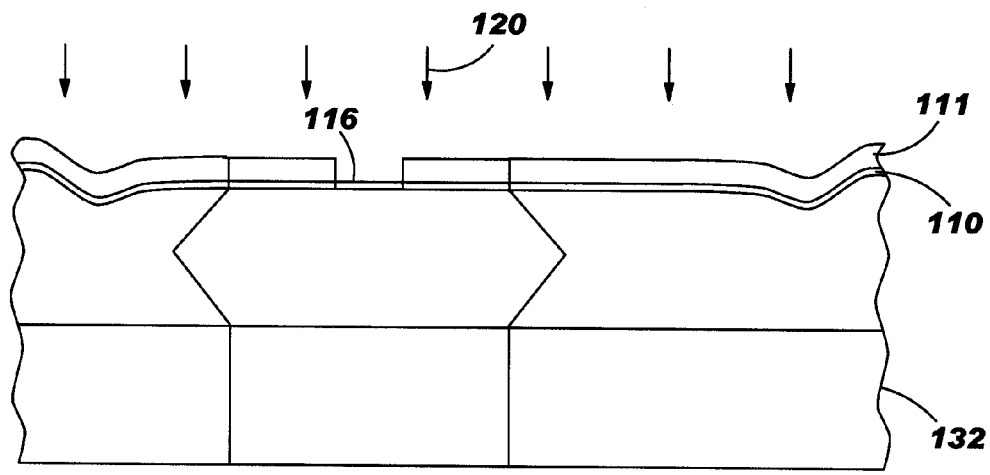

Next, as shown in FIG. 8, oxide layer 110 is reacted to form a reaction product 116, as discussed above. That is, oxide layer 110 is reacted by exposure to a vapor phase etch 120 using, for example, hydrogen fluoride and ammonia, or ammonia bifluoride. Again, the conditions and concentrations of material may vary according to specific applications. In one embodiment, the reaction occurs at room temperature and approximately 5 mTorr. Reaction product 116 includes etched oxide and reactants and combinations thereof.

Figure 9:
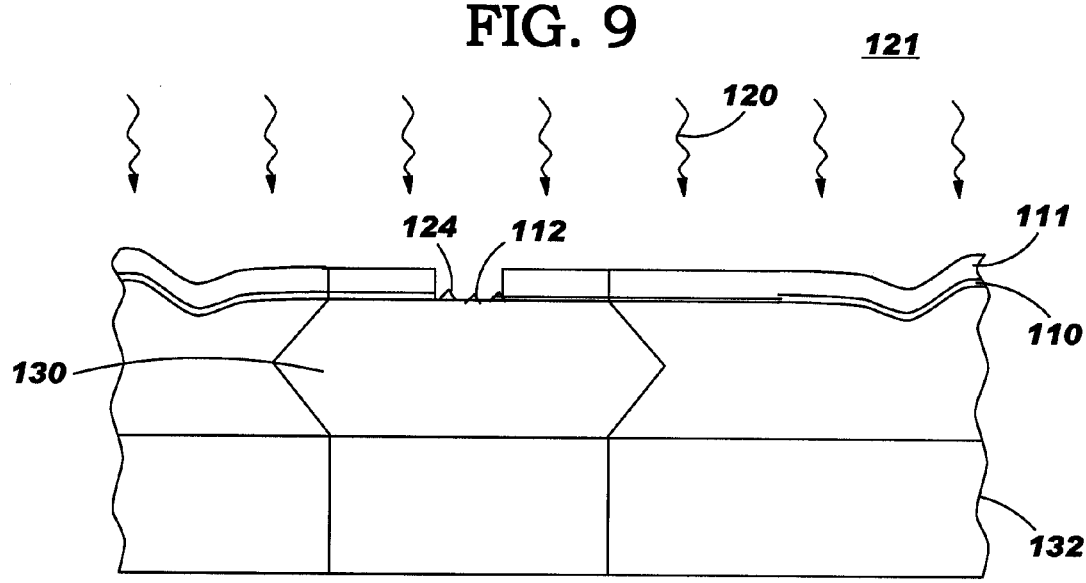

As shown in FIG. 9, the reaction product is removed, as described above, to expose a surface 112 of base 130 (excepting remaining oxide 124). As also shown in FIG. 9, the next step includes annealing surface 112, e.g., substrate, in, for example, a reducing atmosphere 120 to remove any remaining oxide 124. In one embodiment, reducing atmosphere 120 comprises hydrogen (H2). Further, the process temperature is high enough to remove any remaining oxide 124 yet low enough so as to not disturb, for example, a boron implant (not shown) in single crystal base 130. A preferred process temperature range to satisfy these conditions is from approximately 700° C. to approximately 800° C., and occur for approximately 5–15 seconds.

Figure 10:
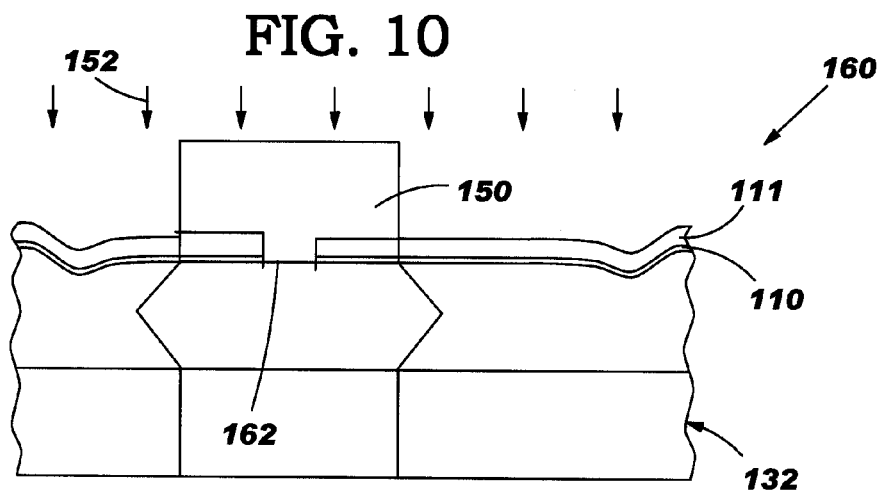

Finally, as shown in FIG. 10, a single crystal emitter 150 may be formed on exposed surface 112 of base 130 to complete HBT 160. In one embodiment, this step is provided by an ISD 152 of arsenic (As) doped silicon. HBT 160 formed with this embodiment show improved AC performance. For example, single crystal ISD (As) doped emitter devices have exhibited an Re significantly less than implanted polysilicon emitter devices.

The resulting HBT 160 does not contain any oxide interface at the emitter-base interface 162. As a result, HBT 160 exhibits improved emitter resistance (Re). The above-described process also provides for reliable reproduction of a low Re HBT within a lot and across a wafer. Another advantage is that emitter film crystallinity is improved with fewer defects, which enhances NPN yield by reducing defects penetrating through the emitter to the collector. Improved yields of approximately 15% have been attained using the above-described method. Further, NPN DC parameter characterization, such as tighter transistor current gain (Beta) distribution, increased emitter base junction reverse breakdown voltage (Bvebo) and decreased emitter base junction capacitance (Ceb), and defects such as voids or misfit dislocation are reduced in the emitter region, which improves dopant distribution and dopant diffusion caused by the defects. Another advantage of the above-described method is that the removing, annealing and emitter forming steps may occur in the same process tool, which reduces process complexity. In addition, the removing, annealing and emitter forming step may be performed in an oxygen-free ambient to prevent formation of a native oxide layer.

EXAMPLE APPLICATION 2

Figure 11:
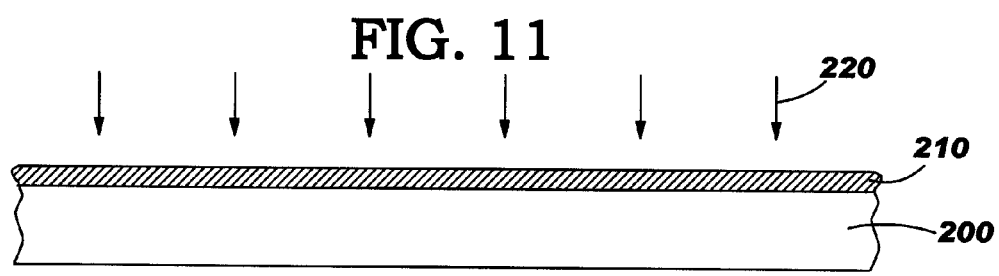
FIGS. 11–14 show a method of forming an interface between a first single crystal silicon layer and a second single crystal silicon layer using the method of FIGS. 2–5.
Figure 12:
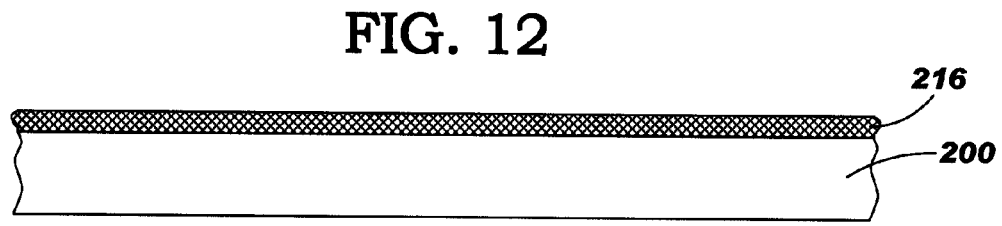
Figure 13:
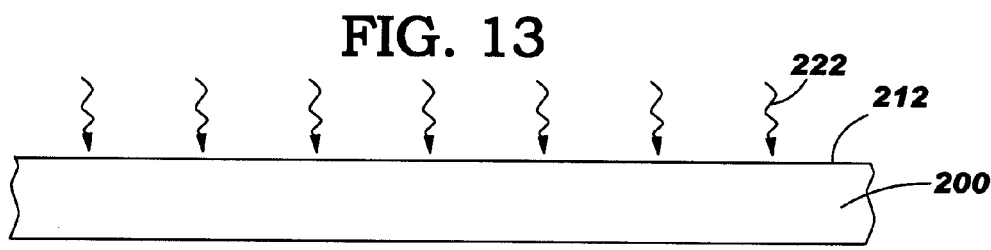
Figure 14:
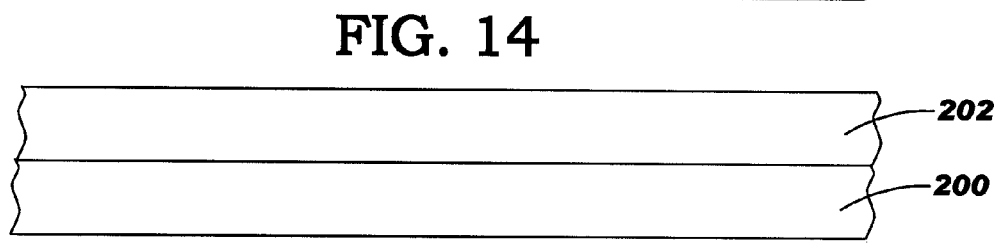

In another illustrative application, the above-described method may be implemented to form an interface between a first single crystal silicon layer and a second single crystal silicon layer. In this application, the method may include: a) forming a silicon dioxide layer 210 on single crystal silicon layer 200, as shown in FIG. 11; b) reacting at least a portion of the silicon dioxide layer 210 to form a reaction product layer 216, as shown in FIG. 12; c) removing reaction product layer 216 to expose a surface 212 of single crystal silicon layer 200; d) annealing in, for example, a reducing atmosphere 222; and e) forming a single crystal silicon layer 202 on surface 212 of single crystal silicon layer 200, as shown in FIG. 14.

While the inventive method has been described in detail relative to illustrative applications including a method of forming a vertical HBT and a method forming an interface between a single crystal silicon layers, it should be recognized that the invention is applicable to practically any semiconductor fabrication process in which oxide is removed. The invention thus finds applicability in other fabrication processes such as those for a raised source/drain in CMOS, SOI devices, FET gate oxide, etc.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a vertical bipolar transistor having a single crystal base formed on a substrate, the method comprising the steps of:

a) forming a silicon dioxide layer and a dielectric layer on the single crystal base;

b) forming an emitter window in the dielectric layer over the single crystal base to expose a portion of the silicon dioxide layer;

c) reacting the portion of the silicon dioxide layer to form a reaction product layer;
d) removing the reaction product layer from the emitter window to expose a surface of a portion of the single crystal base;
e) annealing the substrate in an inert atmosphere; and
f) forming a single crystal emitter on the exposed surface of the single crystal base.

2. The method of claim 1, wherein steps (d)–(f) are performed in an oxygen-free ambient to prevent formation of a native oxide layer.

3. The method of claim 1, wherein steps (d)–(f) are performed in the same process chamber.

4. The method of claim 1, wherein the annealing step (e) comprises a temperature from approximately 700° C. to approximately 800° C.

5. The method of claim 1, wherein the single crystal base includes germanium.

6. The method of claim 1, wherein the dielectric layer comprises silicon nitride.

7. The method of claim 1, wherein the reacting step (c) comprises a vapor phase etch.

8. The method of claim 1, wherein the removing step includes evaporating the reaction product from the surface.

9. The method of claim 1, wherein the step (e) comprises annealing in a reducing atmosphere.

10. The method of claim 9, wherein the reducing atmosphere comprises hydrogen.

11. A method of forming an interface between a first single crystal silicon layer and a second single crystal silicon layer, the method comprising the steps of:
a) forming a silicon dioxide layer on the second single crystal silicon layer;
b) reacting at least a portion of the silicon dioxide layer to form a reaction product layer;
c) removing the reaction product layer to expose a surface of the second single crystal silicon layer;
d) annealing in an inert atmosphere; and
e) forming the first single crystal silicon layer on the surface of the second single crystal silicon layer.

12. The method of claim 11, wherein the inert atmosphere comprises hydrogen.

* * * * *